United States Patent [19]

Chen et al.

[11] Patent Number: 5,387,802

[45] Date of Patent: Feb. 7, 1995

[54] HIGH-SPEED ELECTRONIC SWITCH HAVING LOW EFFECTIVE SERIES RESISTANCE

[75] Inventors: Chun-Chun Chen, Taipei, Taiwan, Prov. of China; S. Hoi Tsao, Ottawa, Canada

[73] Assignee: Industrial Technology Research Institute, Taiwan, Prov. of China

[21] Appl. No.: 56,533

[22] Filed: May 5, 1993

[51] Int. Cl.⁶ .......................................... H03F 17/00
[52] U.S. Cl. ............................. 250/551; 327/365; 327/514
[58] Field of Search ............... 250/551; 307/311, 491, 307/572

[56] References Cited

U.S. PATENT DOCUMENTS

| | | | |
|---|---|---|---|
| 3,912,951 | 10/1975 | Kihara | 307/311 |
| 4,039,863 | 8/1977 | Ohhinata et al. | 307/311 |
| 4,369,371 | 1/1983 | Hara et al. | 307/311 |
| 4,410,810 | 10/1983 | Christen | 307/311 |
| 4,516,019 | 5/1985 | Eertink et al. | 307/311 |
| 4,611,123 | 9/1986 | McDonald | 307/311 |
| 4,651,023 | 5/1987 | Parsonage | 307/311 |
| 4,745,311 | 5/1988 | Iwasaki | 307/311 |
| 4,804,866 | 2/1989 | Akiyama | 307/311 |
| 4,961,015 | 10/1990 | Shin et al. | 307/572 |
| 5,089,948 | 2/1992 | Brown et al. | 307/311 |

Primary Examiner—David C. Nelms
Assistant Examiner—Stephone B. Allen
Attorney, Agent, or Firm—Bacon & Thomas

[57] ABSTRACT

An electronic switch comprising: a switch device and an on-resistance ($R_{ON}$) compensation feed-back control device; wherein said Ron compensation feed-back control circuit able to bypass the current flow of said switch device to said Ron compensation feed-back control circuit when said switch device is on.

8 Claims, 1 Drawing Sheet

HIGH-SPEED ELECTRONIC SWITCH HAVING LOW EFFECTIVE SERIES RESISTANCE

FIELD OF THE INVENTION

The present invention relates to a low-resistant high-speed electronic switch, especially to an electronic switch with very short reaction time and low $R_{ON}$ (The effective series resistance of a switch when it is in the ON state). According to this invention the reaction time of the low-resistance high-speed electronic switch may be several microseconds with its $R_{ON}$ of less than one milliohm. The switch of the present invention is suitable for electronic components used in precise instruments.

BACKGROUND OF THE INVENTION

It has been a development in electrical switching techniques to use electronic signals, in replacement of mechanical operation such as used in conventional relays, in the control of switch devices. Electronic switches, such as MOSFET switches, are welcomed by their users because of its compactness and short reaction time of several microseconds. Mechanical switches are, however, still commonly used by the industry, because they have lower $R_{ON}$ than electronic switches. In application the $R_{ON}$ of mechanical switches ranges about several milliohms but $R_{ON}$ of electronic switches ranges about several ohms. As a result, mechanical switches are always used in precise electronic circuits such as in the automatic control systems of precise measurement instruments, in spite of their longer reaction time (in milliseconds).

It is thus a need of the industry to have an electronic switch which has lower on-resistance and shorter reaction time.

A purpose of this invention is to provide a low-resistance high-speed electronic switch with lower $R_{ON}$ and shorter reaction time.

Another purpose of this invention is to provide a low-resistance high-speed electronic switch with lower $R_{ON}$ and higher off-resistance ($R_{OFF}$).

Another purpose of this invention is also to provide a low-resistance high-speed electronic switch which may be used in highly isolated environments.

SUMMARY OF THE INVENTION

In accordance with one aspect of a preferred embodiment of the invention, an electronic switch comprises a switching device and a $R_{ON}$ compensation feed-back control circuit, accompanied by a $R_{OFF}$ enhancement circuit and a highly isolated power supply. The most significant advantage of this invention is its low $R_{ON}$ and high reaction speed. With the help of the $R_{ON}$ compensation feed-back control circuit the $R_{ON}$ of this invention may be reduced to several milliohms or less, with reaction time of about several microseconds. This invention also results in a higher $R_{OFF}$ and is suitable for applications in highly isolated environments.

The above and other objects, features and advantages of the invention will be more apparent from the following description of a preferred embodiment thereof as illustrated in the accompanying drawings.

DETAILED DESCRIPTION OF THE INVENTION

Figure 1:
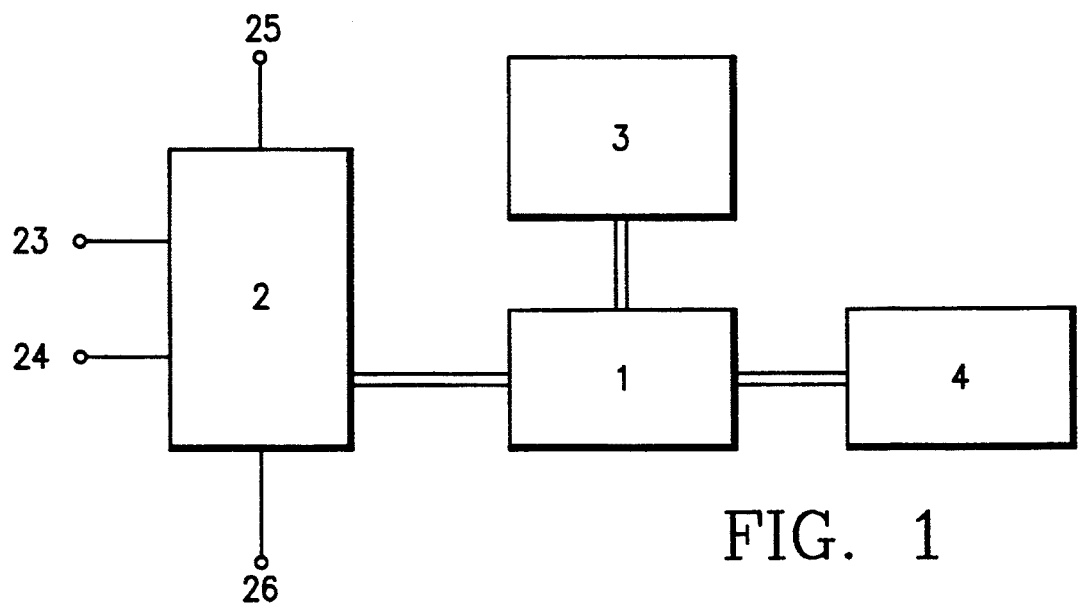
FIG. 1 is a system diagram of the low-resistance high-speed electronic switch of the invention.

FIG. 1 is a system diagram of the low-resistance high-speed electronic switch of the invention. According to FIG. 1, the low-resistance high-speed electronic switch of the invention comprises a $R_{ON}$ compensation feed-back circuit 1 and a switching device 2. The $R_{ON}$ compensation feed-back control circuit 1 may bypass the current flow of the switching device 2 to the $R_{ON}$ compensation feed-back control circuit 1 while the switching device 2 is on, so that the voltage drop across the switching device 2 may be reduced, thus lowering the effective $R_{ON}$ of the switching device 2. 3 represents a $R_{OFF}$ enhancement circuit which maintains a high off-resistance while the switching device 2 is off. The $R_{OFF}$ enhancement circuit 3 enhances the $R_{OFF}$ by avoiding an expected decrease in the $R_{OFF}$ of the circuit because of the additional $R_{ON}$ compensation circuit 1. 4 is a highly isolated power supply, used to supply electric power to the $R_{ON}$ compensation feed-back control circuit 1.

EMBODIMENT

Figure 2:
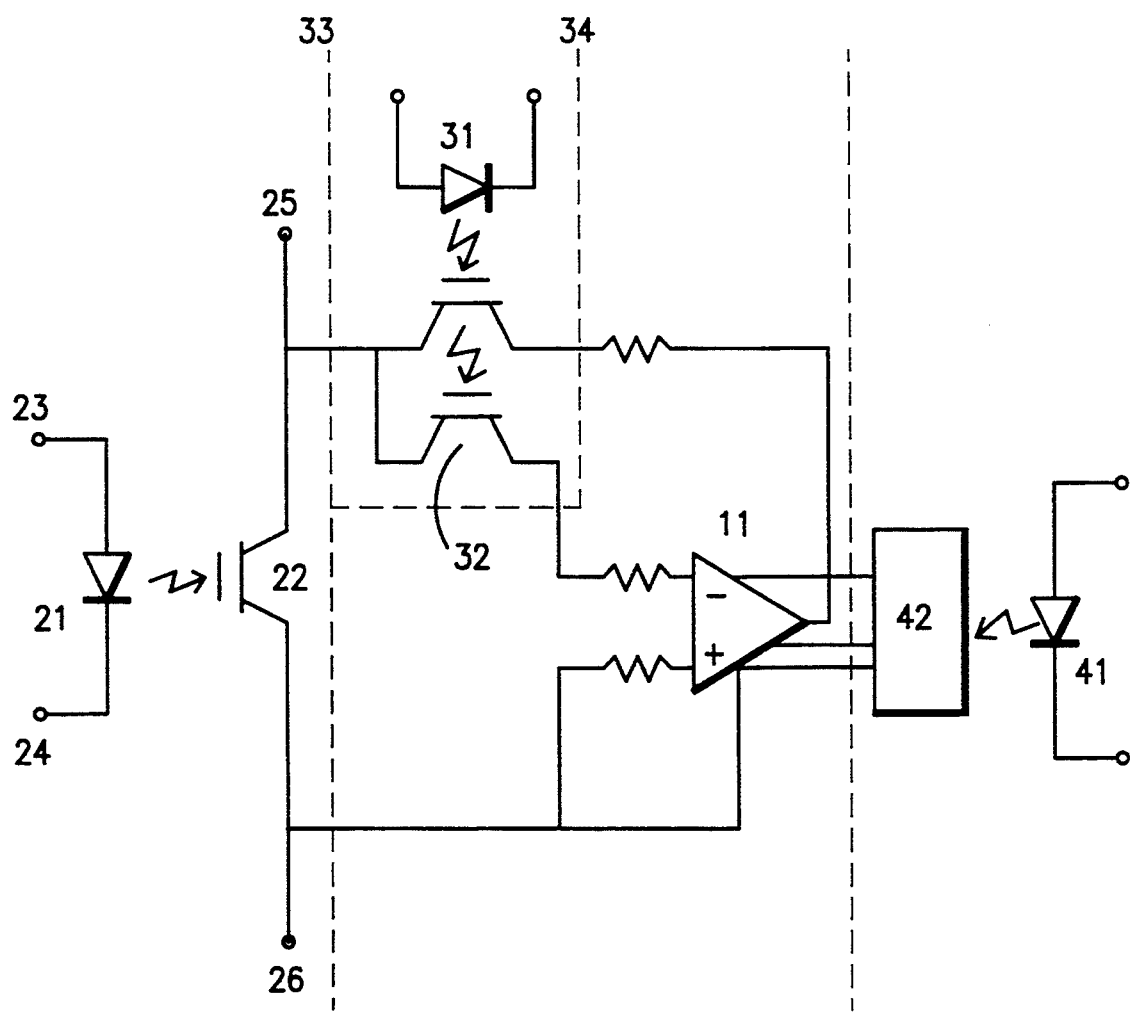
FIG. 2 is a circuit diagram of a preferred embodiment of the low-resistance high-speed electronic switch of the invention.

FIG. 2 is a circuit diagram of an embodiment of the low-resistance high-speed electronic switch of this invention. As shown in the figure, the low-resistance high-speed electronic switch includes at least a light emitting diode (LED) 21, a opto-electronic switch 22 and an operational amplifier 11. In this circuit, when the light emitted by the LED 21 reaches the opto-electronic switch the switch 22 turns on. Normally the resistance value of the opto-electronic switch is about several ohms. However, the switch's current flow is bypassed to the operational amplifier 11 so that, in effect, the $R_{ON}$ of this circuit can be lowered to about several milliohm by connecting the + and − inputs of operational amplifier (comparator) 11 to the respective input 26 and output 25 of switch 22, the output of operational amplifier 11 being the difference in current between the switch input and output. The signal output by operational amplifier 11 is added to the output of switch 22 to make-up for the current lost due to the resistance $R_{ON}$ and effectively lower the resistance to zero.

When the circuit turns off, the operational amplifier 11 in the circuit may reduce the off-resistance of the circuit. In this embodiment an opto-electronic switch 32 is introduced adjacent to the operational amplifier 11 and LED 31, which operation is synchronized with that of the LED 21, is used to control the opto-electronic switch 32. In actual application LED 21 and LED 31 may be one LED. As the opto-electronic switch 32 turns off at the same time when the opto-electronic switches 22 turns off, the $R_{OFF}$ of the switch 22 will be very high, because the operational amplifier 11 will not affect the $R_{OFF}$ of the switch 22.

In order to use the invention under highly isolated environments, this embodiment includes an opto-electric cell 42 as the power supply of the operational amplifier 11. In actual application the light source of the opto-electric cell 41 may be the same light source of the switches 22 and 32, in other words, the LED 21 or 31. As a result in the embodiment, only one LED may be used to function as an isolated power source for the operational amplifier 11 and the source of control signals for the opto-electronic switches 22 and 32.

Results of experiments proved that the low-resistance high-speed electronic switch of this invention has the following effects:

1. Reaction time: approximately several microseconds.
2. $R_{ON}$: approximately several milliohm.
3. $R_{OFF}$: approximately several T ohm ($10^{12}$ ohm).

Using only one LED to function as power source as well as emitter of control signals is also a novel advantage of this invention.

As the invention has been shown and described with reference to a preferred embodiment thereof, those skilled in the art will recognize that the above and other changes may be made therein without departing from the spirit and scope of the invention.

What is claimed is:

1. An electronic switch comprising:
   a switching device having an input and an output; and
   an $R_{ON}$ compensation feed-back control device which includes means for lowering an effective on resistance $R_{ON}$ of the switching device by detecting an amount of current lost due to $R_{ON}$ and adding the lost current to the current flow through said switching device while said switching device is on, said control device including a current source connected between the input and output of the switching device, the current source supplying current to said output based on a difference in current between said input and output.

2. The electronic switch according to claim 1 wherein said switching device comprises a light source and an opto-electronic switch and said $R_{ON}$ compensation feed-back control device comprises an operational amplifier having one input connected to an input of the switching device and a second input connected to said output of the switching device, and an output connected to the output of the switching device.

3. The electronic switch according to claim 1 further comprising a $R_{OFF}$ enhancement circuit, used to isolate the resistance value of said $R_{ON}$ compensation feed-back control device while said switching device is off.

4. The electronic switch according to claim 3 wherein said switching device comprises a light source and an opto-electronic switch, said $R_{ON}$ compensation feed-back control device is an operational amplifier having one input connected to the input of the switching device and a second input connected to the output of the switching device, and said $R_{OFF}$ enhancement circuit comprises a light source and an opto-electronic switch connected between the output of the switching device and said second input.

5. The electronic switch according to claim 4 wherein said light source for said switching device and said light source for said $R_{OFF}$ enhancement circuit are one and same light source.

6. The electronic switch according to claim 3, further comprising an isolated power supply to supply electric power to said $R_{ON}$ compensation feed-back control device.

7. The electronic switch according to claim 6 wherein said switching device comprises a light source and a opto-electronic switch, said $R_{ON}$ compensation feed-back control device is an operational amplifier, said $R_{OFF}$ enhancement circuit comprises a light source and an opto-electronic switch, and said isolated power supply is an opto-electric cell.

8. The electronic switch according to claim 7 wherein said light source for said switching device, said light source for said $R_{OFF}$ enhancement circuit and the light source for the opto-electric cell is one and same light source.

* * * * *